United States Patent
Krishnasamy et al.

(10) Patent No.: US 10,058,998 B2
(45) Date of Patent: Aug. 28, 2018

(54) TIME-OPTIMAL TRAJECTORIES FOR ROBOTIC TRANSFER DEVICES

(71) Applicant: BROOKS AUTOMATION, INC., Chelmsford, MA (US)

(72) Inventors: Jayaraman Krishnasamy, Billerica, MA (US); Martin Hosek, Lowell, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 78 days.

(21) Appl. No.: 15/376,119

(22) Filed: Dec. 12, 2016

(65) Prior Publication Data

US 2017/0087720 A1     Mar. 30, 2017

Related U.S. Application Data

(63) Continuation of application No. 14/342,035, filed as application No. PCT/US2012/052977 on Aug. 30, 2012, now Pat. No. 9,517,558.
(Continued)

(51) Int. Cl.
    *H01L 21/67*     (2006.01)
    *B25J 9/16*     (2006.01)
    (Continued)

(52) U.S. Cl.
    CPC ..........  *B25J 9/1664* (2013.01); *G05B 19/416* (2013.01); *H01L 21/67259* (2013.01);
(Continued)

(58) Field of Classification Search
    CPC ........... G05B 2219/34175; G05B 2219/39242; G05B 2219/40449; G05B 2219/40466; G05B 2219/40519
See application file for complete search history.

(56) References Cited

U.S. PATENT DOCUMENTS

| | | |
|---|---|---|
| 4,663,726 A | 5/1987 | Chand et al. |
| 5,655,060 A | 8/1997 | Lucas |

(Continued)

FOREIGN PATENT DOCUMENTS

| | | |
|---|---|---|
| CN | 101359224 | 2/2009 |
| CN | 101898358 | 12/2010 |

(Continued)

OTHER PUBLICATIONS

International Search Report, International Application No. PCT/US2012/052977, dated Nov. 6, 2012.

*Primary Examiner* — Ryan Rink
(74) *Attorney, Agent, or Firm* — Perman & Green, LLP; Colin C. Durham

(57) ABSTRACT

A time-optimal trajectory generation method, for a robotic manipulator having a transport path with at least one path segment, comprising generating a forward time-optimal trajectory of the manipulator along the at least one path segment from a start point of the at least one path segment towards an end point of the at least one path segment, generating a reverse time-optimal trajectory of the manipulator along the at least one path segment from the end point towards the start point of the at least one path segment, and combining the time-optimal forward and reverse trajectories to obtain a complete time optimal trajectory, where the forward and reverse trajectories of the at least one path segment are blended together with a smoothing bridge joining the time-optimal forward and reverse trajectories in a position-velocity reference frame with substantially no discontinuity between the time-optimal forward and reverse trajectories.

19 Claims, 12 Drawing Sheets

Related U.S. Application Data

(60) Provisional application No. 61/530,651, filed on Sep. 2, 2011.

(51) Int. Cl.
*H01L 21/677* (2006.01)
*G05B 19/416* (2006.01)

(52) U.S. Cl.
CPC .. *H01L 21/67742* (2013.01); *H01L 21/67766* (2013.01); *G05B 2219/40449* (2013.01); *G05B 2219/40466* (2013.01)

(56) References Cited

U.S. PATENT DOCUMENTS

| | | | |
|---|---|---|---|
| 6,216,058 B1 | 4/2001 | Hosek et al. | |
| 8,294,405 B2 | 10/2012 | Hoffmann et al. | |
| 2001/0016157 A1 | 8/2001 | Sundar | |
| 2004/0249509 A1 | 12/2004 | Rogers et al. | |
| 2009/0037021 A1 | 2/2009 | Sladek et al. | |
| 2010/0234974 A1* | 9/2010 | Bosga | B30B 1/266 |
| | | | 700/100 |
| 2010/0305753 A1 | 12/2010 | Weiss et al. | |
| 2014/0297031 A1 | 10/2014 | Iwasaki | |
| 2015/0081156 A1 | 3/2015 | Trepagnier et al. | |

FOREIGN PATENT DOCUMENTS

| | | |
|---|---|---|
| JP | 63253408 | 10/1988 |
| JP | 11503369 | 3/1999 |
| JP | 2001277160 | 10/2001 |
| TW | 399008 | 7/2000 |
| TW | 448092 | 8/2001 |
| WO | 9630896 | 10/1996 |

\* cited by examiner

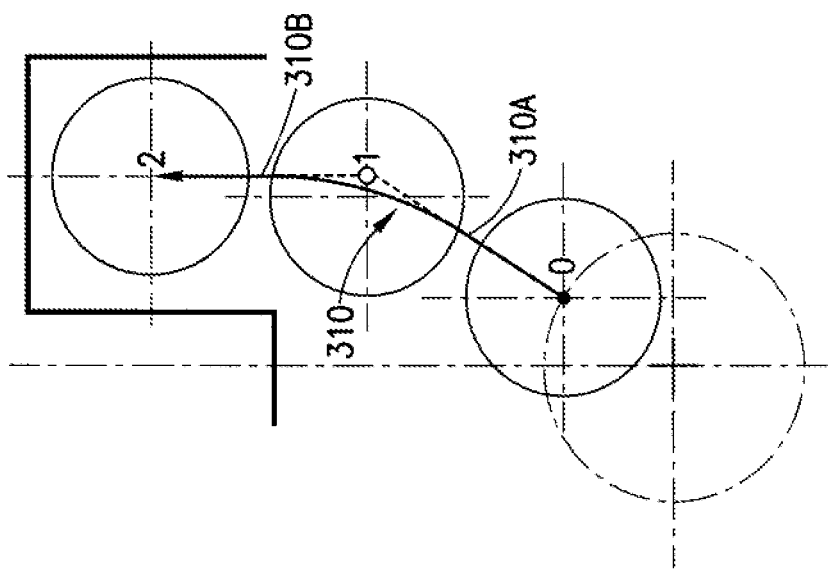
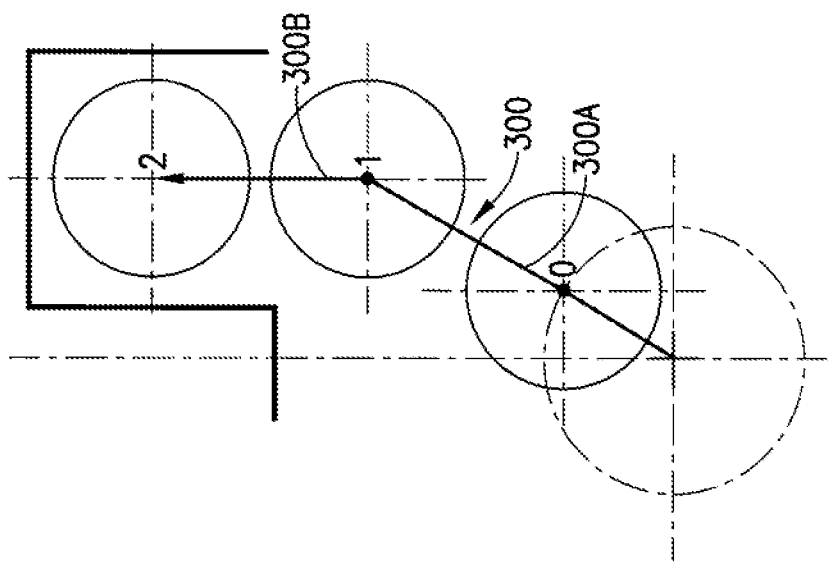

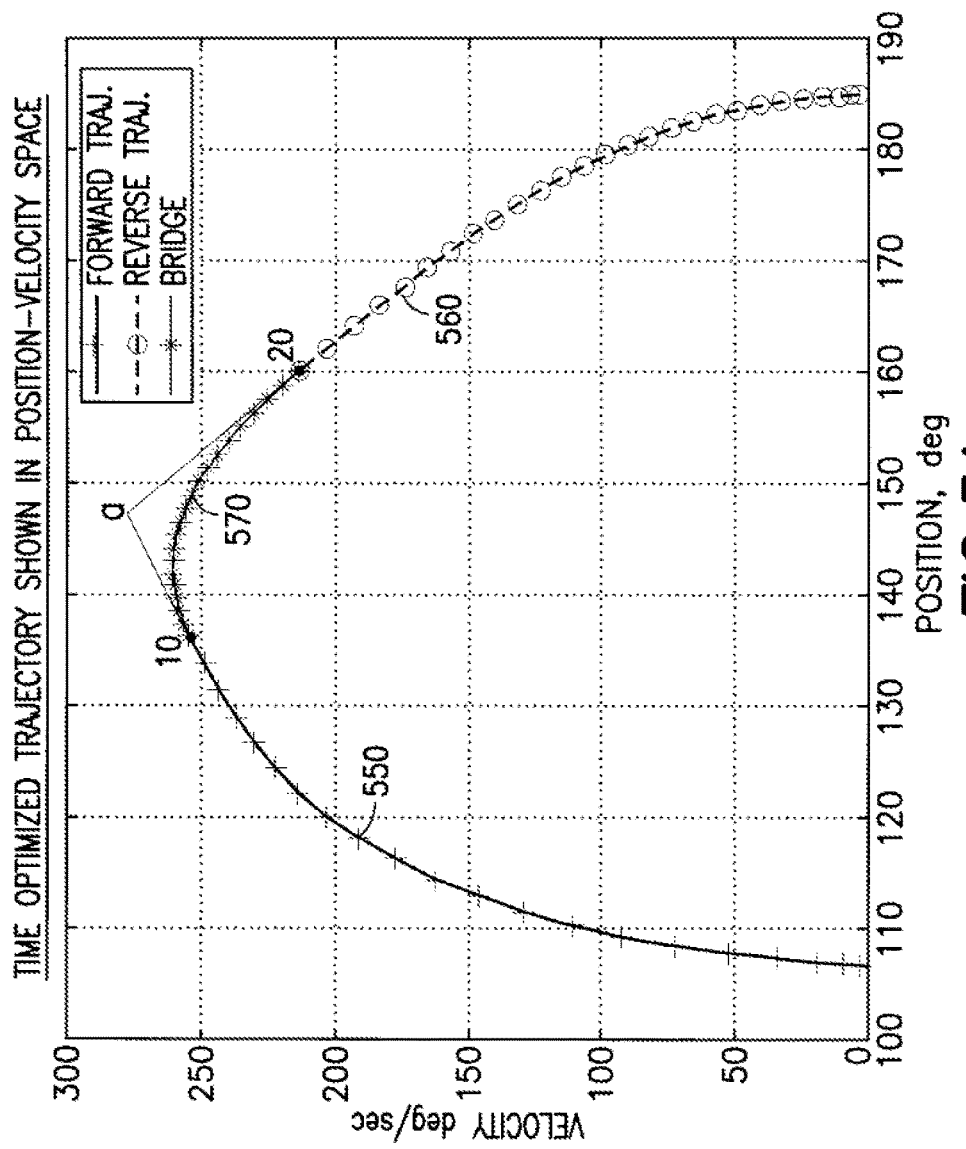

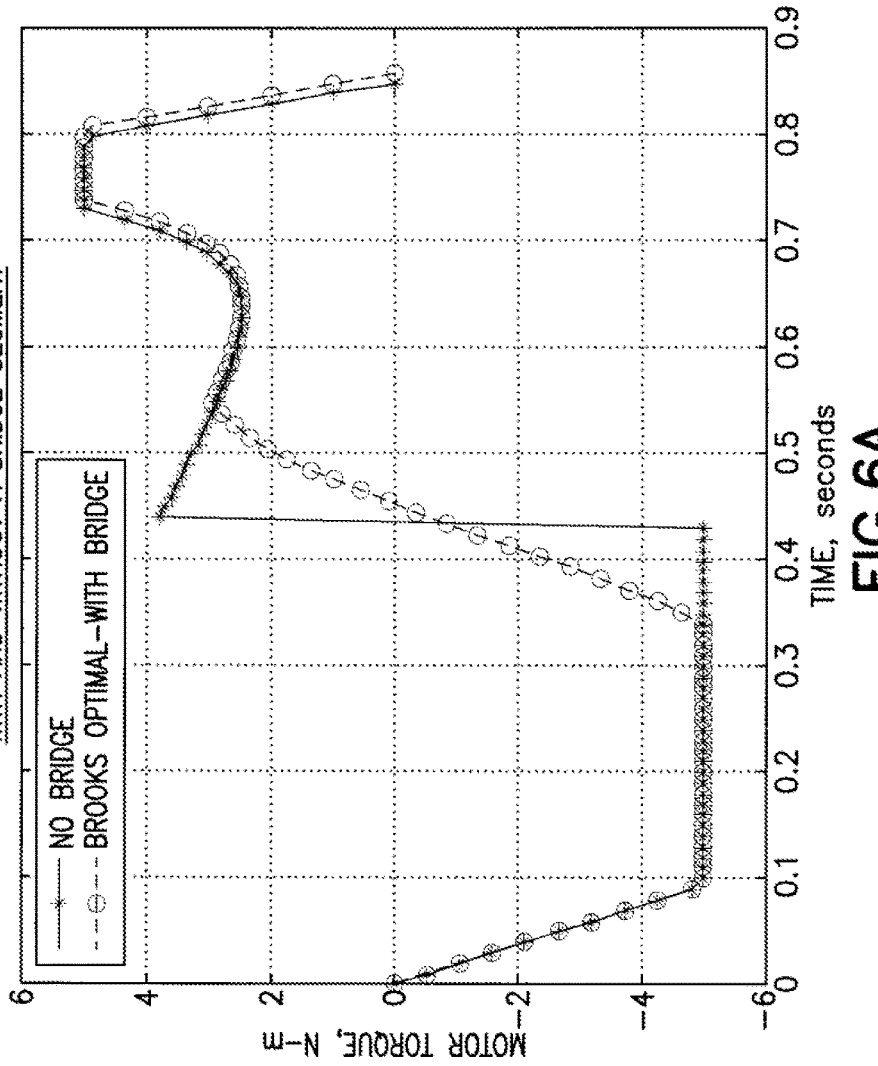

TIME-OPTIMAL TRAJECTORIES FOR ROBOTIC TRANSFER DEVICES

CROSS-REFERENCE TO RELATED APPLICATIONS

This application is a continuation of U.S. patent application Ser. No. 14/342,035, filed on 9 May 2014, (now U.S. Pat. No. 9,517,558), which is the National Stage Application of International Application No. PCT/US2012/052977 having international Filing Date of 30 Aug. 2012, which designated the United States of America, and which international Application was published under PCT Article 21 (2) as WO Publication 2013/033289 A1 and which claims priority from, and benefit of U.S. Provisional Application No. 61/530,651 filed on 2 Sep. 2011, the disclosures of which are incorporated herein by reference in their entireties.

BACKGROUND

1. Field

The exemplary embodiments generally relate to robotic manipulators and, more particularly, to a method and means for the generation of smooth time-optimal trajectories for robotic manipulators.

2. Brief Description of Related Developments

Trajectory generation is typically used when transferring substrates held by a robotic manipulator from one blade to another. While robotic systems for carrying light place can be over-designed to provide necessary torque margins, increased peak torque requirements become a factor for performance, size, cost and life of both direct-drive and harmonic-drive robotic manipulators for high or heavy payloads. Conventional trajectory generation methods generally do not account for torque constraints or do not produce a smooth commanded trajectory. For example, a well known servo control approach can be found in the paper entitled "Time-optimal control of robotic manipulators along specified paths" from Bobrow et al. (International Journal of Robotic Research, Vol. 4, No. 3, 1985), which generally operates to establish switching points between acceleration and deceleration of a robot end effector without exceeding a maximum tolerable velocity. The switching points generally operate to change the system state in minimum time while at all times using all available system power. This approach is sometimes also referred to as bang-bang control.

While time-optimal, some real world applications can limit the viability of this approach due to the presence of variable or unquantifiable system resonances. More particularly, abrupt changes in jerk (change in acceleration with respect to time) can serve as a broad spectrum excitation of the system, resulting in unacceptably long settle times at the final position.

Conventional systems to remove: discontinuities in trajectories from bang-bang control, such as Bobrow et al., by constraining trajectory profiles or kinematic characteristics of the trajectory profiles such as acceleration, jerk and jerk rate result in non-optimal trajectories and hence lower efficiencies. This is especially so for robotic systems configured to handle large, heavier payloads.

It would be advantageous to provide trajectory generation that, e.g., uses maximum system torque and payload accelerations and provides smooth command time-optimal trajectories.

BRIEF DESCRIPTION OF THE DRAWINGS

The foregoing aspects and other features of the disclosed embodiments are explained in the following description, taken in connection with the accompanying drawings, wherein:

FIGS. 3A-3D are exemplary substrate transport paths to which aspects of the disclosed embodiment may be applied;

FIG. 5A is an exemplary graph illustrating a time-optimized trajectory in accordance with an aspect of the disclosed embodiment;

FIG. 6A is an exemplary graph illustrating motor torque in a time-optimal trajectory generated in accordance with an aspect of the disclosed embodiment;

DETAILED DESCRIPTION

Figure 1:
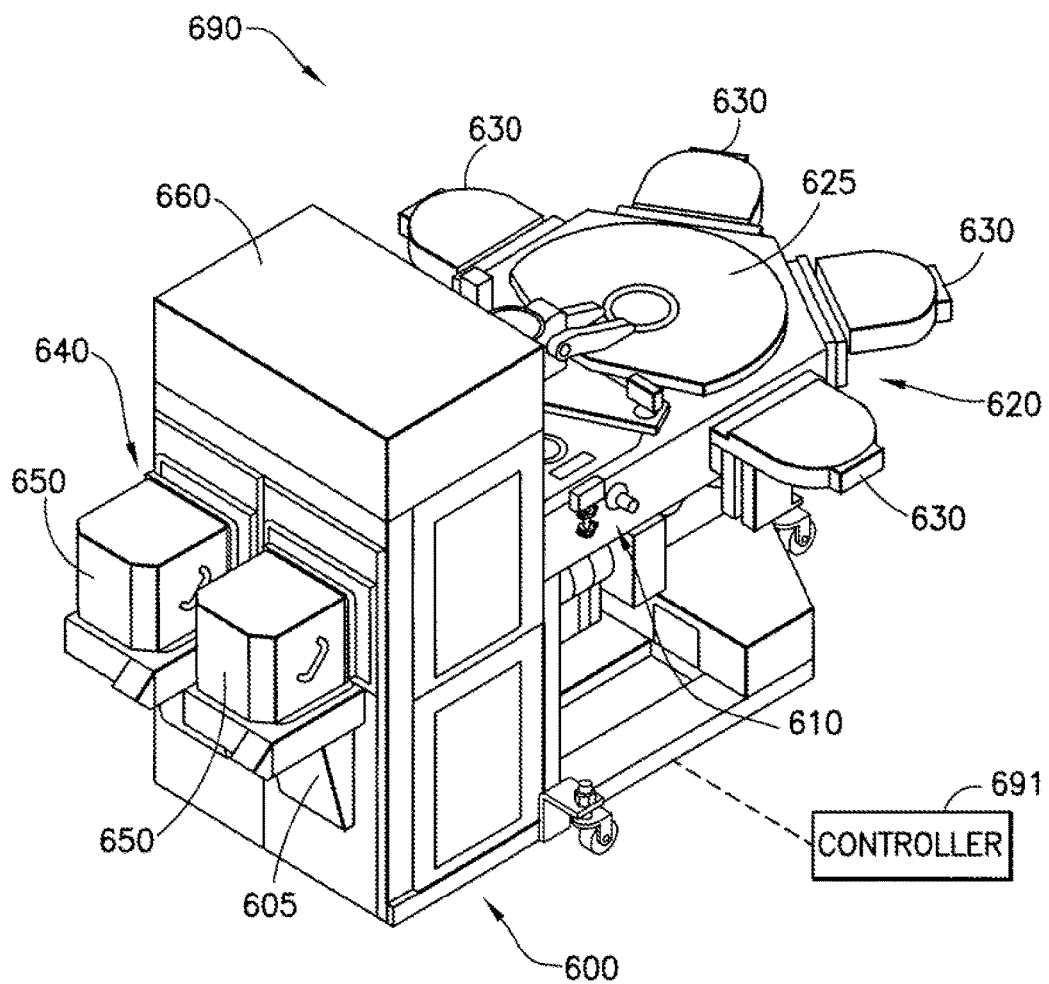
FIG. 1 is a schematic illustration of a processing tool incorporating aspects of the disclosed embodiment.

FIG. 1 illustrates an exemplary substrate processing apparatus in which aspects of the disclosed embodiment can be used. Although the aspects of the disclosed embodiment will be described with reference to the drawings, it should be understood that the disclosed embodiment can be embodied in many alternate forms. In addition, any suitable size, shape or type of elements or materials could be used.

As can be seen in FIG. 1, a substrate processing apparatus, such as for example a semiconductor tool station 690 is shown in accordance with an aspect of the disclosed embodiment. Although a semiconductor or substrate processing tool is shown in the drawings, the aspects of the disclosed embodiment described herein can be applied to any tool station or application employing robotic manipulators. The substrate processing tool 690 may include different sections having, for example, different atmospheres separated by, for example, a load lock 610 (e.g. inert gas on one side and vacuum on the other, or atmospheric clean air on one side and vacuum/inert gas on the other). In one aspect the tool 690 is shown as a cluster tool, however aspects of the disclosed embodiments may be applied to any suitable tool station such as, for example, a linear tool station such as that shown in FIG. 2 and described in U.S. patent application Ser. No. 11/442,511, entitled "Linearly Distributed Semiconductor Workpiece Processing Tool," filed May 26, 2006, the disclosure of which is incorporated by reference herein in its entirety. Other exemplary substrate processing tools in which aspects of the disclosed embodiment may be used include but are not limited to U.S. patent application Ser. No. 12/123,329 filed May 19, 2008; U.S. patent application Ser. No. 12/123,365 filed May 19, 2008; U.S. patent application Ser. No. 12/330,780 filed Dec. 9, 2008; U.S. patent application Ser. No. 13/159,034 filed Jan. 13, 2011; U.S. patent application Ser. No. 12/542,588 filed Aug. 17, 2009; and U.S. Pat. Nos. 7,575,406; 7,959,395; and 7,988,398 all of which are incorporated by reference herein in their entireties. The tool station 690 generally includes an atmospheric front end 600, a vacuum load lock 610 and a vacuum back end 620. In other aspects of the disclosed embodiment, the tool station may have any suitable configuration. The components of each of the front end 600, load lock 610 and back end 620 may be connected to a controller 691 which may be part of any suitable control architecture such as, for example, a clustered architecture control. The control system may be a closed loop controller having a master controller, cluster controllers and autonomous remote controllers such as those disclosed in U.S. patent application Ser. No. 11/178,615, entitled "Scalable Motion Control System," filed Jul. 11, 2005 (now U.S. Pat. No. 7,904,182), the disclosure of which is incorporated by reference herein in its entirety. In other aspects of the disclosed embodiment, any suitable controller and/or control system may be utilized. The controller of the processing tool, such as controller 691, or any other suitable controller connected to the substrate processing tool may include a processor and/or a memory configured to generate the optimal trajectories as described herein. In one aspect the controller 691 may be configured for what is known as being a "bang-bang" controller that controls the robotic transport such that all available power is used (e.g. max torque) to effect motion of the robotic transport as otherwise further described below.

In one aspect, the front end 600 generally includes load port modules 605 and a mini-environment 660 such as for example an equipment front end module (EFEM). The load port modules 605 may be box opener/loader to tool standard (BOLTS) interfaces that conform to SEMI standards E15.1, E62, E19.5 or E1.9 for 300 mm load ports, front opening or bottom opening boxes/pods and cassettes. In alternate embodiments, the load port modules may be configured as 200 mm wafer interfaces, 400 mm wafer interfaces, or any other suitable substrate interfaces such as for example larger or smaller wafers or flat panels for flat panel displays, LED (light emitting diode) panels and solar panels. Although two load port modules are shown in FIG. 1, in other aspects of the disclosed embodiment any suitable number of load port modules may be incorporated into the front end 600. The load port modules 605 may be configured to receive substrate carriers or cassettes 650 from an overhead transport system, automatic guided vehicles, person guided vehicles, rail guided vehicles or from any other suitable transport method. The load port modules 605 may interface with the mini-environment 660 through load ports 640. The load ports 640 may allow the passage of substrates between the substrate cassettes 650 and the mini-environment 660. The mini-environment 660 generally includes a transfer robot (not shown) for transporting the substrates from the cassettes 650 to, for example, the load lock 610. In one aspect, the transfer robot may be a track mounted robot such as that described in, for example, U.S. Pat. No. 6,002,840, the disclosure of which is incorporated by reference herein in its entirety or any other suitable transfer robot including but not limited to SCARA (Selective Compliant Articulated Robot Arm) robots, frog-leg robots, linear sliding arm robots and four bar-link robots where the robotic manipulators have one or more arms each having one or more end effectors or substrate holders (e.g. each may be capable holding one or more substrates). Other suitable examples of robots include those found in U.S. patent application Ser. No. 11/148,871 filed on Jun. 9, 2005; U.S. patent application Ser. No. 11/179,762 filed on Jul. 11, 2005; U.S. patent application Ser. No. 12/117,415 filed May 8, 2008; U.S. patent application Ser. No. 12/117,355 filed May 8, 2008; U.S. patent application Ser. No. 13/219,267 filed Aug. 26, 2011 (now U.S. Pat. No. 8,237,391); U.S. patent application Ser. No. 13/030,856 filed Feb. 18, 2011; and U.S. Pat. Nos. 8,008,884; 6,547,510; 5,813,823; 5,899,658; 5,720,590; and 7,891,935 all of which are incorporated by reference herein in their entireties. The mini-environment 660 may provide a controlled, clean zone for substrate transfer between multiple load port modules.

The vacuum load lock 610 may be located between and connected to the mini-environment 660 and the back end 620. The substrate holding chamber (s) of the load lock 610 generally includes atmospheric and vacuum slot valves. Each slot valve of the chamber(s) may be independently closable by a suitable door (s) of the slot valve. The slot valves may provide the environmental isolation. employed to evacuate the load lock 610 after loading a substrate from the atmospheric front end 600 and to maintain the vacuum in the transport chamber 625 when venting the lock with an inert gas such as nitrogen. In one aspect the load lock 610 may also include an aligner for aligning a fiducial of the substrate to a desired position for processing, a substrate buffer or any other suitable processing apparatus. In other aspects of the disclosed embodiment, the vacuum load lock may be located in any suitable location of the processing apparatus and have any suitable configuration including any suitable substrate processing equipment.

The vacuum back end 620 generally includes transport chamber 625, one or more processing station(s) 630 and a transfer robot (not shown). The transfer robot may be located within the transport chamber 625 to transport substrates between the load lock 610 and the various processing stations 630 and be substantially similar to the transfer robot described above with respect to the mini-environment 660 but for the use of the robot in a vacuum environment. The processing stations 630 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 630 are connected to the transport chamber 525 to allow substrates to be passed from the transport chamber 625 to the processing stations 630 and vice versa.

Figure 2:
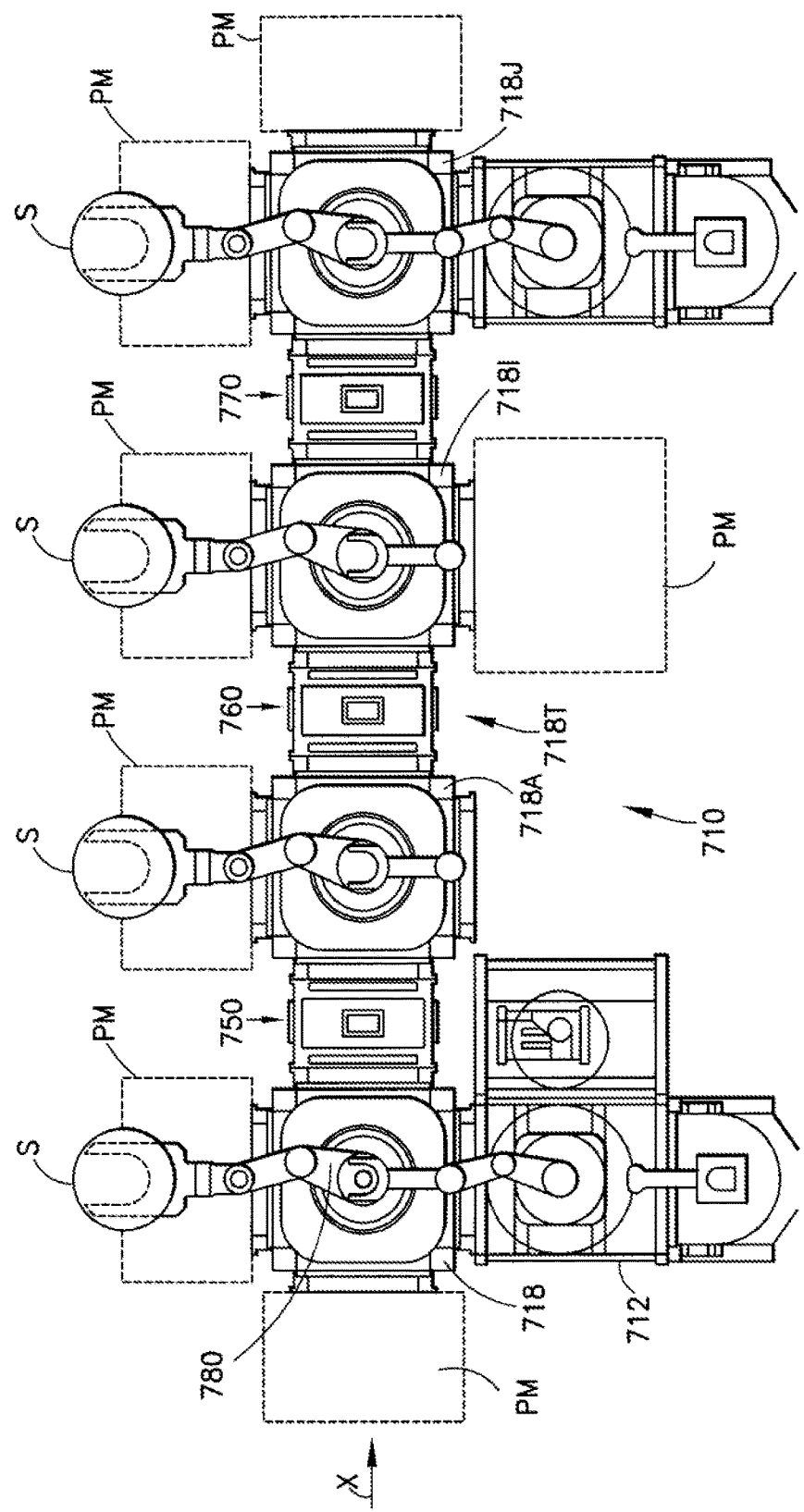
FIG. 2 is a schematic illustration of another processing tool incorporating aspects of the disclosed embodiment.

Referring now to FIG. 2, another exemplary substrate processing tool 710 having different sections is shown. In this aspect, the processing tool is a linear processing tool where the tool interface section 712 is mounted to a transport chamber module 718 so that the interface section 712 is facing generally towards (e.g. inwards) but is offset from the longitudinal axis X of the transport chamber 718T. The transport chamber module 718 may be extended in any suitable direction to extend a length of the transport chamber 718T by attaching other transport chamber modules 718A, 718I, 718J to interfaces 750, 760, 770 as described in U.S.

patent application Ser. No. 11/442,511, previously incorporated herein by reference. The interfaces 750, 760, 770 may be substantially similar to the load lock described above with respect to processing tool 690. Each transport chamber module 718, 719A, 718I, 718J includes a suitable substrate transport 780 for transporting substrates throughout the processing system 710 and into and out of, for example, processing modules PM. In one aspect the transport 780 may be substantially similar to those described above. As may be realized, each chamber module may be capable of holding an isolated or controlled atmosphere (e.g. N2, clean air, vacuum). In other aspects, the transport chamber modules 718, 719A, 718I, 718J may include features of the load lock 510 as described herein.

Referring now to FIGS. 3A-3D, exemplary transport paths of a substrate on an end effector of a robotic transport are shown in accordance with aspects of the disclosed embodiment. As may be realized these transport paths may be for any suitable robotic transport such as, for example, the robotic transports described above. As may also be realized a time-optimal trajectory may be generated in accordance with aspects of the disclosed embodiments for each of these exemplary transport paths. It is noted that the term "path" as used herein and depicted in the drawings refers to the physical transport paths of the substrates through a three-dimensional space between substrate holding locations. It is noted that the paths may include one or more segments that are joined to each other to form the path. The term "trajectory" of the path includes the kinematic properties of the substrate transport or at least a portion thereof (e.g. the end effector, arm links, drive motor, etc.) such as acceleration, velocity, etc. moving along the transport path.

Figure 3D:
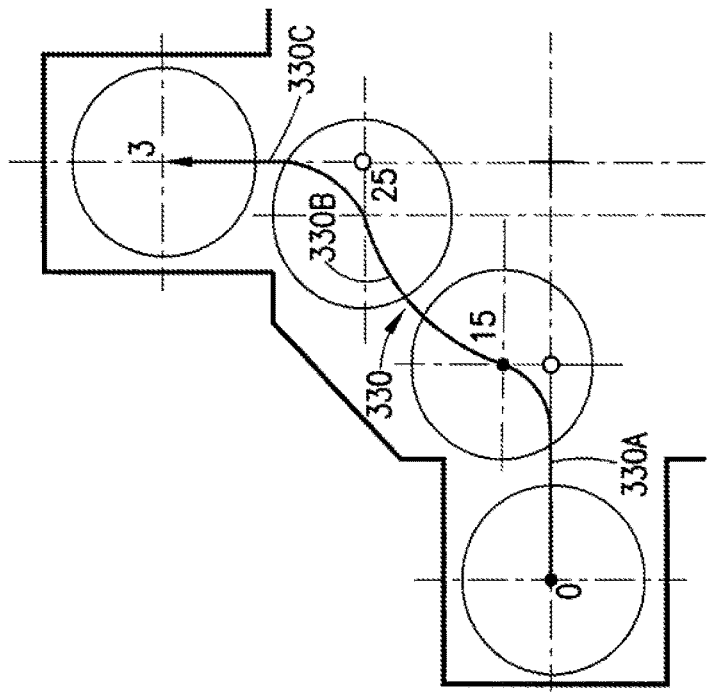
Figure 3C:
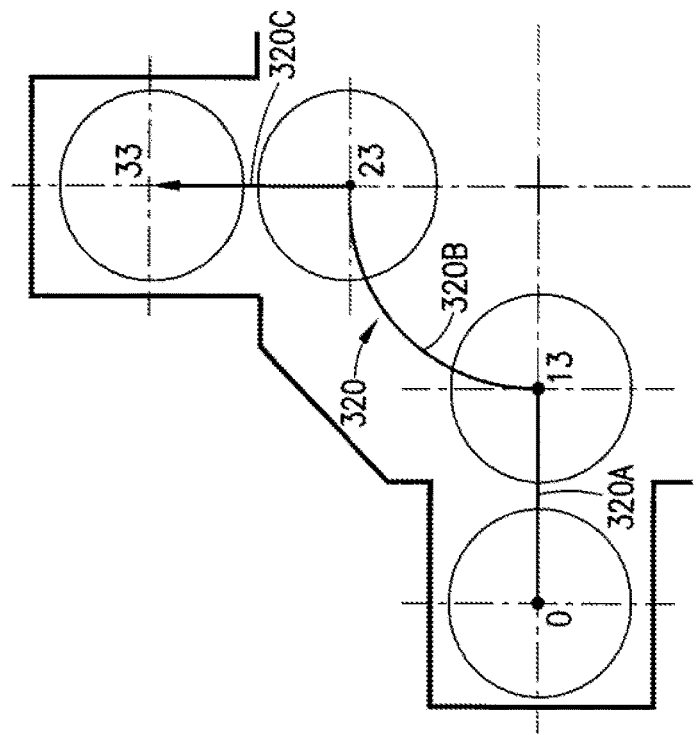

As can be seen in FIG. 3A one suitable substrate transport path 300 may be a rectilinear transport path having, for example, two segments 300A and 300B where each segment is substantially a straight line so that the substrate travels along the rectilinear path formed by the segments 300A, 300B. Another suitable transport path 310, shown in FIG. 3B, may have at least a portion of the path be a curved or non-linear where the substrate movement between segments 310A and 310B is blended so that the substrate follows a substantially smooth curve for transitioning between the segments 310A and 310B. FIGS. 3C and 3D illustrate compound paths 320, 330 that may include any suitable number of rectilinear transport segments and/or curved (i.e. non-linear) transport segments that may or may not be blended together. For example, FIG. 3C illustrates a transport path 320 having three segments where segments 320A and 320B meet at point 13 and segments 320B and 320C meet at point 23. FIG. 3D illustrates path 330 having three segments 330A, 330B, 330C where the segments are joined respectively at points 15 and 25. However, in FIG. 3D the transition between segments 330A and 330B and between segments 330B and 330C are blended by any suitable smooth transition curve. As may be realized, in other aspects, the transport paths may be any suitable transport paths including one or more segments forming any suitably shaped path for transporting substrates between any suitable substrate holding stations (e.g. an initial/starting point and a final/ending point). The path can have any suitable shape, and the trajectory along the path (e.g. the kinematic properties) may be established in the linear frame of reference for the path. As may also be realized the transport paths may be two-dimensional or three-dimensional transport paths including any suitable number of paths segments that are combined and/or blended to form an optimal path between the starting and ending points of the path.

As described above, any suitable controller, such as controller 691, may be configured as a bang-bang controller for generating time-optimal motions of at least a portion of the robotic transport, such as the end effector, using maximum power of the robotic transport drive. It is noted the aspects of the disclosed embodiment allow for the generation of otherwise unparameterized substrate transport trajectories having motor torque: (e.g. maximum torque/peak torque) and/or substrate acceleration constraints for, e.g., high payload applications or any other suitable payload applications. The term unparameterized as used herein with respect to the generated trajectories means that the trajectory is unconstrained as to the curve or shape of the trajectory (either with respect to time or in the position-velocity reference frame or space) such that a time-optimal trajectory shape is achieved within the noted constraints of available maximum motor torque: (e.g. the maximum torque as specified by the motor manufacturer) of the robotic manipulator, a maximum substrate acceleration limit (e.g. a point at which the substrate begins to slip on the substrate holder of the robotic manipulator), and/or a maximum velocity limit. In accordance with the aspects of the disclosed embodiments trajectories can be generated for each of the path segments such that optimal (shortest) move times (e.g. substrate transport times between a starting and ending point) are achieved for given maximum drive torque constraints. Further, peak torque requirements for drive components, such as motors and harmonic gear boxes, can be reduced (with or without the shorter move times) leading to lower costs associated with the robotic transport, reduced size of the robotic transport and/or increased life of the robotic transport. The aspects of the disclosed embodiment address the deficiencies of existing trajectory generation methods which generally do not take into consideration torque constraints or generally do not produce a smooth commanded trajectory. The term "smoothness" as used herein with respect to the generated trajectories refers to a continuous acceleration over time. It is noted that a discontinuity in acceleration is generally not practically achievable and undesired resulting in excitation of natural vibration modes of, for example, the arm of the robotic transport as well as significant tracking errors.

Figure 5B:
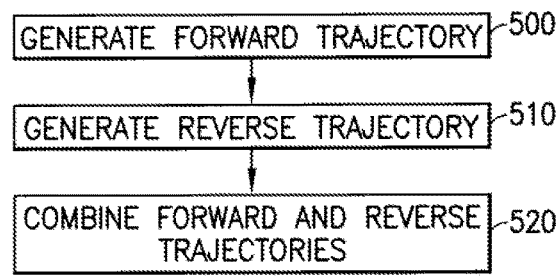
FIG. 5B is a flow chart illustrating the generation of time-optimal trajectory in accordance with an aspect of the disclosed embodiment.

In one aspect of the disclosed embodiment referring to FIG. 5A, a time-optimal trajectory (which may also be referred to as a torque-optimal trajectory) that operates to change the state of the system in minimum time, e.g. using maximum available torque, may be generated for each segment of the substrate transport path (the transport path may have more than one set of segments as illustrated in e.g. FIGS. 3C and 3D), where the time-optimal trajectory may be obtained by generating at least a portion of a time-optimal forward. trajectory 550 from the start point (e.g. in the position-velocity reference frame) (Block 500, FIG. 5B), generating at least a portion of a time-optimal reverse trajectory 560 from the end point (e.g. in the position-velocity reference frame) (Block 510, FIG. 5B), and combining the forward and reverse trajectories to generate the complete time-optimal trajectory (Block 520, FIG. 5B). It is noted that the portions of the time-optimal forward and reverse trajectories can be generated in any suitable order and not necessarily in the order listed above. It is also noted that the time-optimal forward and reverse trajectories may be any suitable optimal trajectories based on, for example, the motor torque, substrate acceleration and/or velocity constraints described herein. In one aspect, only the portions of the time-optimal forward and reverse trajectories between the respective start and end points and the apex of the trajectory may be generated while in other aspects the complete time-optimal forward and reverse trajectories may be generated. The aspects of the disclosed embodiment provide for the combination of the forward and reverse trajectories such that a smoothing "bridge" segment 570 joins a point on the forward trajectory to a point on the reverse trajectory. The time duration of this bridge segment 570 may be obtained in any suitable manner such as by the integral of the inverse of the velocity with respect to position so that the bridge segment satisfies the acceleration continuity condition at its endpoints. In one aspect the smoothing bridge 570 is a mathematical blending algorithm that substantially eliminates discontinuity between the forward and reverse trajectories 550, 560. In one aspect the smoothing bridge 570 may mathematically be a quadratic Bezier curve in the position-velocity reference frame but it should be understood. that in other aspects the smoothing bridge 570 may be any other suitable curve or rounding approach such as, for example, a third order Bezier curve or a cubic spline. The smoothing curve 570, such as for example, the Bezier curve may be an algorithm that is fit/splined through a numerical solution between the forward and reverse trajectories.

Figure 4:
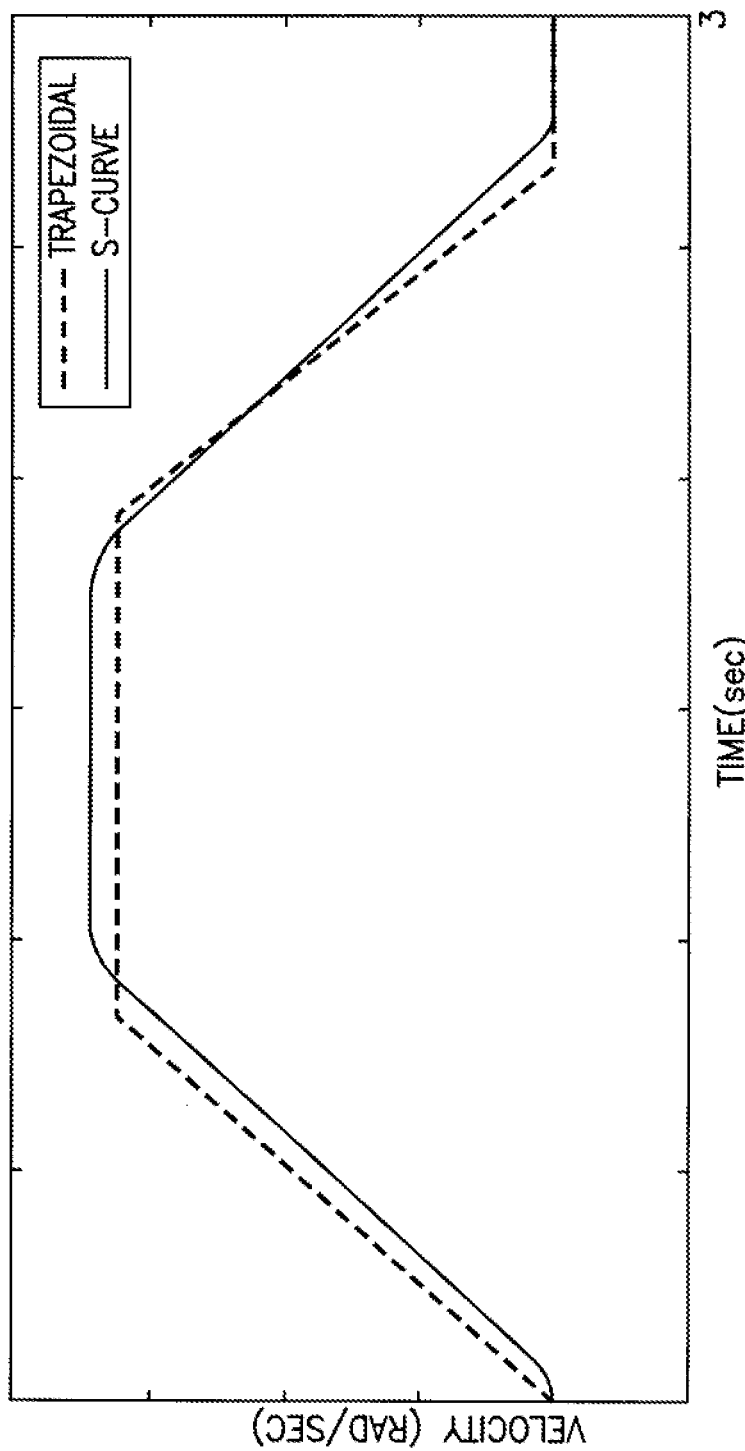
FIG. 4 illustrates an "S-curve profile" of a conventional trajectory of a robot arm.

Referring to FIG. 4, an illustration of a "trapezoidal velocity profile" and a "S-curve profile" for minimizing substrate transfer time are shown. These plots show velocity with respect to time curves for commanded velocity at the robot arm drive motor. However, the trapezoidal velocity profile and S-curve profile are not time-optimal when compared with the trajectories generated in accordance with the aspects of the disclosed embodiment. As can be seen in FIG. 4 there are portions of the S-curve and trapezoidal curve where the velocity (and hence the acceleration) are constant such that maximum available power is not used when generating the trajectory).

With reference again to FIG. 5A an exemplary illustration of a trajectory generated in accordance with the aspects of the disclosed embodiment is shown. For non-limiting exemplary purposes only, the motion profiles are generated for a radial extend motion for a SCAP arm robotic manipulator. In this example, again for non-limiting exemplary purposes only, the trajectory is constrained by a maximum R-motor (e.g. radial extension motor) torque limit of about 5 Nm and a maximum substrate acceleration limit of about 0.3 g. A radial extension of about 400 mm of the robot arm is considered in FIG. 5A.

FIG. 5A illustrates the optimal trajectory of, for example, FIGS. 7A-7C (described below) in a position-velocity reference frame. As can be seen in FIG. 5A the forward trajectory segment 550, the reverse trajectory segment 560, and the bridging segment 570 are shown. In one aspect, at each of the points of contact or interfaces 10, 20 with the forward and reverse trajectory segments 550, 560, the bridging segment 570 has substantially the same tangent and amplitude as a respective one of the forward and reverse trajectory segments 550, 550. As described above, in one aspect the bridging or bridge segment 570 may be defined as a quadratic Bezier curve (but in other aspects the bridge segment may be defined in any suitable manner by any suitable curve such as, for example, a third order Bezier curve) in which the position p and velocity v are defined in terms of the position and velocity at points 10, 20 and a, where a is defined as the point of intersection of the tangents of the forward and reverse trajectories 550, 560 at points 10 and 20. In one aspect the position p and velocity v may be defined as follows:

$$p(\tau)=p_1(1-\tau)^2+2p_a(1-\tau)\tau+p_2\tau^2 \qquad [1]$$

$$v(\tau)=v_1(1-\tau)^2+2v_a(1-\tau)\tau+v_2\tau^2 \qquad [2]$$

where the parameter τ varies from 0 to 1. The progression of time can he obtained as a function of the parameter τ as follows:

$$t(\tau) = \int_0^\tau \frac{dp}{d\tau}\frac{1}{v}d\tau \qquad [3]$$

Figure 5C:
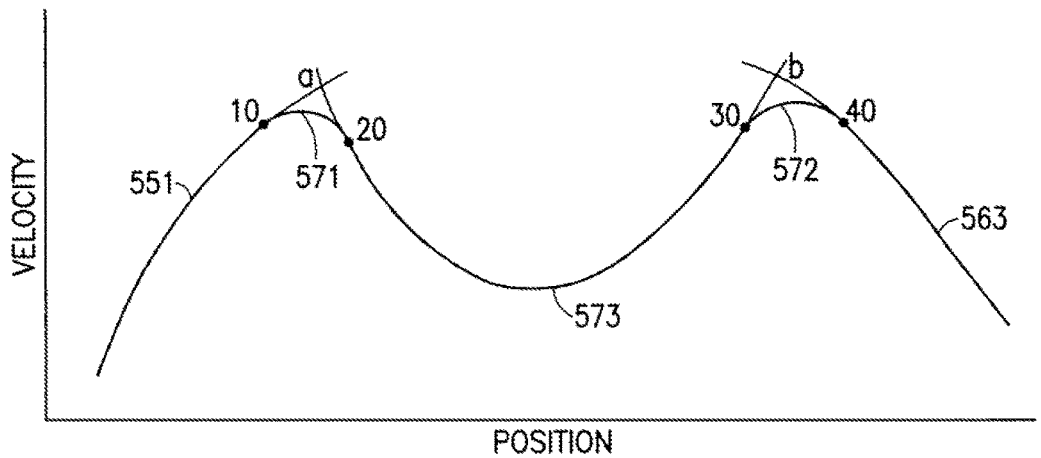
FIGS. 5C and 5D are exemplary graphs illustrating time-optimized trajectories in accordance with aspects of the disclosed embodiment.
Figure 5D:
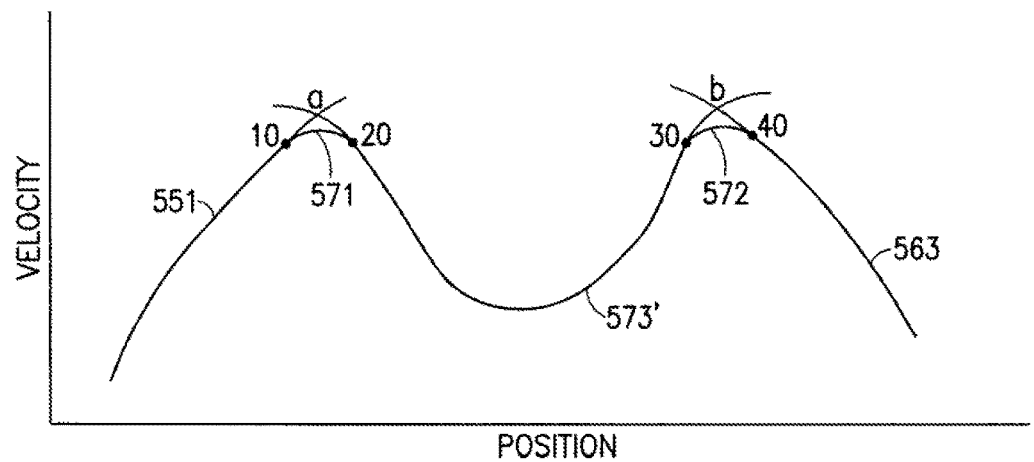

It is noted that the points 10 and 20 are chosen so that the characteristics of the trajectory curve (e.g. velocity, change in velocity and rate of change in velocity) at all points in the bridge segment are equal to or below the corresponding characteristics of the forward and reverse segments as extending respectively forward and reverse from the corresponding points 10, 20 (e.g. looking at FIG. 5A the bridge segment remains underneath the extensions of each of the forward and reverse trajectories that intersect at point a, and related characteristics of the bridge segment such as slope and change in slope are below comparable characteristics of the respective extensions at corresponding points 10, 20). The curve forming the bridge segment may provide any suitable number of degrees of freedom that allows for the satisfaction of the above velocity condition without changing the start and end points. It is again noted that while the aspects of the disclosed embodiment are illustrated with respect to a linear radial motion of the substrate holder, it should be understood that the aspects of the disclosed embodiment is extendable to motion along non-linear paths. The aspects of the disclosed embodiments may also he applied to multiple corner points that need to be smoothed in a given trajectory. For example, referring to FIG. 5C a time-optimal trajectory is shown where a central region of the trajectory curve 573 (that may be generated, for example, either as a forward trajectory or a reverse trajectory) has a reduced velocity due to, for example a constraint on velocity in this region of the trajectory. In this aspect there are two points a, b that are to be smoothed in accordance with aspects of the disclosed embodiments. Here, the forward trajectory 551 is generated in a manner substantially similar to that described above from a respective start point. The reverse trajectory 563 is also generated in a manner substantially similar to that described above from a respective end point. It is also noted that while the trajectory curve 573 is shown as having a concave shape or slope in other aspects the trajectory may have a convex slope or a combination of a convex and concave slope as shown in FIG. 5D (see trajectory 573') so that the portions of the trajectory curve 573' intersecting trajectories 551, 563 have a convex slope and the central portion of trajectory curve 573' has a concave slope. The points a and b are bridged in a manner substantially similar to that described above such that the characteristics of the trajectory curves (e.g. velocity, change in velocity and rate of change in velocity) corresponding to bridge segments 571, 572 at all points in the bridge segment are equal to or below (as may be seen in FIGS. 5A, 5C and 5D) the corresponding characteristics of the forward and reverse segments as extending respectively forward and reverse from the corresponding points 10, 20, 30, 40 (e.g. looking at FIG. 5C and 5D the bridge segments remain underneath the extensions of each of the forward and reverse trajectories that intersect at point a and point b and related characteristics of the bridge segments such as slope and change in slope are below comparable characteristics of the respective extensions at corresponding points 10, 20, 30, 40).

Figure 6B:
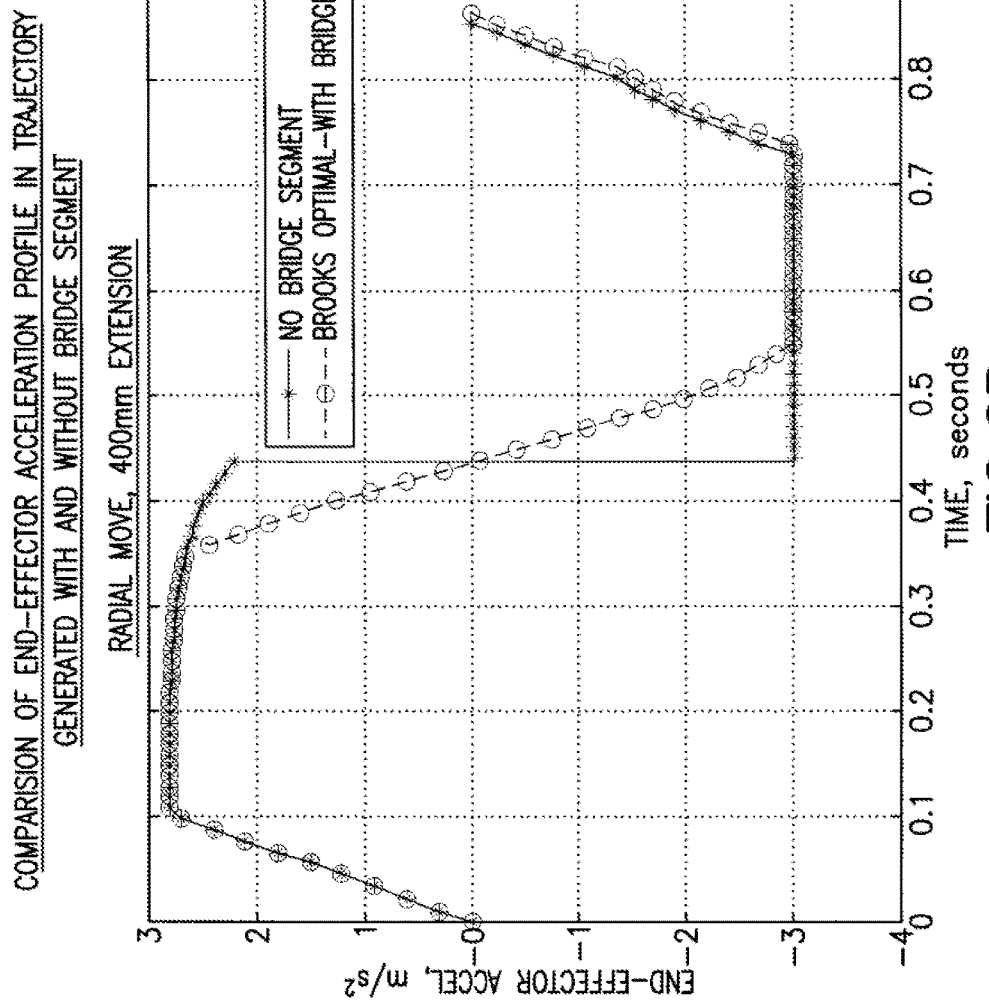
FIG. 6B is an exemplary graph illustrating an end effector acceleration profile in a time-optimal trajectory generated in accordance with an aspect of the disclosed embodiment.

FIG. 6A is an exemplary graph illustrating a comparison of motor torque in an optimal trajectory with and without the bridge segment. FIG. 6B is an exemplary graph illustrating a comparison of a substrate holder acceleration profile within the trajectory with and without the bridge segment.

Figure 7A:
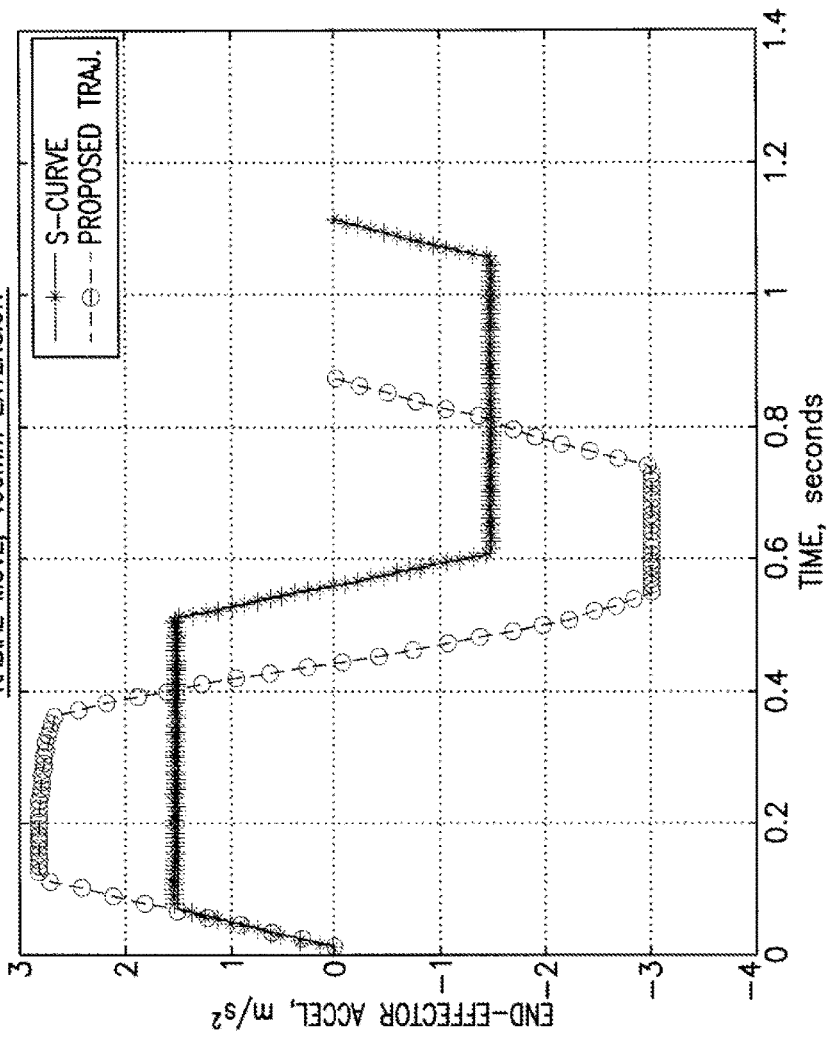
FIG. 7A is an exemplary graph illustrating an acceleration plot versus time in accordance with an aspect of the disclosed embodiment.
Figure 7B:
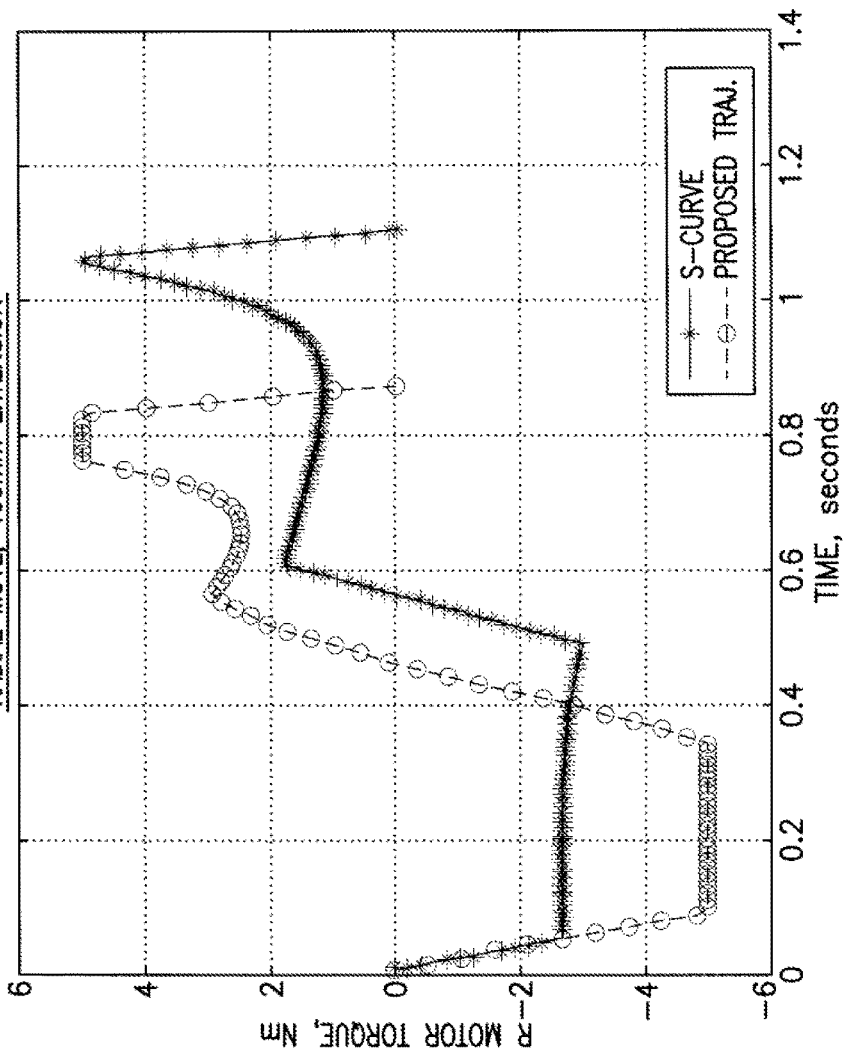
FIGS. 7B and 7C are exemplary graphs illustrating motor torque plots versus time in accordance with aspects of the disclosed embodiment.
Figure 7C:
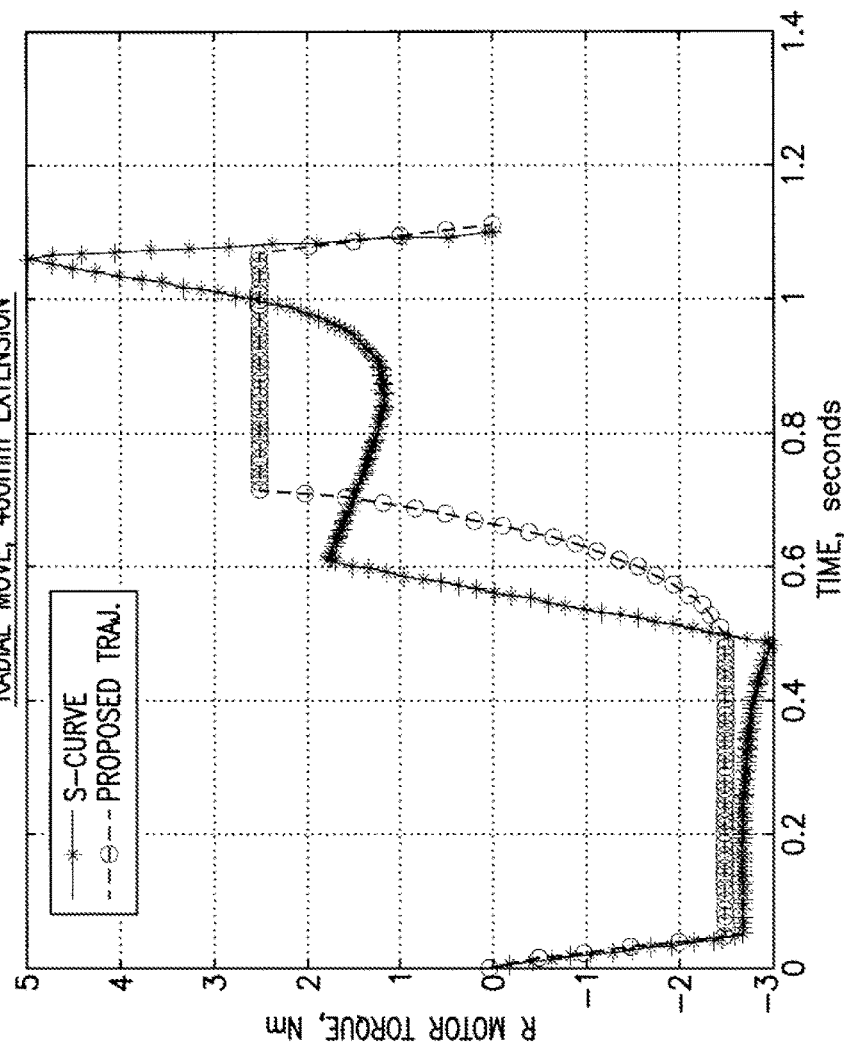

Referring now to FIGS. 7A-7C, FIG. 7A compares the substrate acceleration profiles using a time-optimized trajectory in accordance with an aspect of the disclosed embodiment with a standard S-curve trajectory (see also FIG. 4) generated for the end effector or substrate holder motion where the substrate holder is connected to the arm of the robotic manipulator (see FIG. 2 which illustrates a substrate holder connected to a SCAPA type robotic arm). The motor torques for the two trajectories (e.g. the time-optimized trajectory and the S-curve trajectory) are shown in FIG. 7B. As can be seen in FIGS. 7A and 7B the time-optimized trajectory optimally utilizes the available motor torque such that the move time of the time-optimized trajectory is approximately 25 percent less than the move time of the standard S-curve trajectory. As such, the trajectory illustrated in FIGS. 7A and 7B may be considered a time-optimal trajectory that includes an optimized torque. FIG. 7C compares the time-optimized trajectory and the standard S-curve trajectory where each trajectory is generated so that the move times are substantially the same. As can be seen in FIG. 7C, for substantially the same move time, the time-optimized trajectory requires about 50 percent less torque than the standard S-curve trajectory generated for the substrate holder motion.

In accordance with one or more aspects of the disclosed embodiment a time-optimal trajectory generation method is provided for a robotic manipulator having a transport path with at least one path segment. The method includes generating a forward time-optimal trajectory of the manipulator along the at least one path segment from a start point of the at least one path segment towards an end point, of the at least one path segment, generating a reverse time-optimal trajectory of the manipulator along the at least one path segment from the end point of the at least one path segment towards the start point of the at least one path segment and combining the time-optimal forward and reverse trajectories to obtain a complete time-optimal trajectory, where the forward and reverse trajectories of the at least one path segment are blended together with a smoothing bridge joining the time-optimal forward and reverse trajectories in a position-velocity reference frame with substantially no discontinuity between the time-optimal forward and reverse trajectories.

In accordance with one or more aspects of the disclosed embodiment, the complete time-optimal trajectory is unparameterized.

In accordance with one or more aspects of the disclosed embodiment, at least one of the time-optimal forward and reverse trajectory is defined by a maximum motor torque of the robotic manipulator.

In accordance with one or more aspects of the disclosed embodiment, the smoothing bridge is connected to each of the time-optimal forward and reverse trajectories at respective end points of the smoothing bridge, where each end point of the smoothing bridge is tangent to a respective one of the time-optimal forward and reverse trajectories at the respective end points in the position-velocity reference frame. In accordance with one or more aspects characteristics of a trajectory of the smoothing bridge at all points in the smoothing bridge are equal to or below corresponding characteristics of the forward and reverse trajectories as extending respectively forward and reverse from the respective end points.

In accordance with one or more aspects of the disclosed embodiment, the complete time-optimal trajectory is substantially independent of the transport path.

In accordance with one or more aspects of the disclosed embodiment, the acceleration along the transport path is substantially continuous for and between the time-optimal forward trajectory, the time-optimal reverse trajectory and the smoothing bridge.

In accordance with one or more aspects of the disclosed embodiment, the smoothing bridge is a numerical solution that fits a curve between the forward and reverse trajectories. In one aspect, the smoothing bridge comprises a quadratic Bezier curve, a third order Bezier curve or cubic spline.

In accordance with one or more aspects of the disclosed embodiment, a respective complete time-optimal trajectory including a respective smoothing bridge is generated for each of the at least one path segments.

In accordance with one or more aspects of the disclosed embodiment, the method further includes blending the endpoints of adjacent ones of the at least one path segment together with a smoothing bridge.

In accordance with one or more aspects of the disclosed embodiment a substrate processing tool is provided. The substrate processing tool includes a robotic manipulator including a substrate holder that travels along a transport path having at least one path segment and a controller connected to the robotic manipulator. The controller is configured to generate a time-optimal forward trajectory of the robotic manipulator along the at least one path segment from a start point of the at least one path segment towards an end point of the at least one path segment, generate a time-optimal reverse trajectory of the robotic manipulator along the at least one path segment from the end point of the at least one path segment towards the start point of the at least one path segment and combine the time-optimal forward and reverse trajectories to obtain a complete time-optimal trajectory, where the time-optimal forward and reverse trajectories of the at least one path segment are blended together with a smoothing bridge joining the time-optimal forward and reverse trajectories in a position-velocity reference frame with substantially no discontinuity between the time-optimal forward and reverse trajectories.

In accordance with one or more aspects of the disclosed embodiment, the complete time-optimal trajectory is unparameterized.

In accordance with one or more aspects of the disclosed embodiment, at least one of the time-optimal forward and reverse trajectory is defined by a maximum motor torque of the robotic manipulator.

In accordance with one or more aspects of the disclosed embodiment, the controller is configured to connect the smoothing bridge to each of the time-optimal forward and reverse trajectories at respective end points of the smoothing bridge, where each end point of the smoothing bridge is tangent to a respective one of the time-optimal forward and reverse trajectories at the respective end points in the position-velocity reference frame. In accordance with one or more aspects characteristics of a trajectory of the smoothing bridge at all points in the smoothing bridge are equal to or below corresponding characteristics of the forward and reverse trajectories as extending respectively forward and reverse from the respective end points.

In accordance with one or more aspects of the disclosed embodiment, the acceleration along the transport path is substantially continuous for and between the time-optimal forward trajectory, the time-optimal reverse trajectory and the smoothing bridge.

In accordance with one or more aspects of the disclosed embodiment, the smoothing bridge comprises a quadratic Bezier curve, a third order Bezier curve or a cubic spline.

In accordance with one or more aspects of the disclosed embodiment, the controller is configured to generate a complete time-optimal trajectory including a respective smoothing bridge for each of the at least one path segments.

In accordance with one or more aspects of the disclosed embodiment, the controller is further configured to blend the endpoints of adjacent ones of the at least one path segment together with a smoothing bridge.

In accordance with one or more aspects of the disclosed embodiment, the complete time-optimal trajectory is substantially independent of the transport path.

It is noted that the aspects of the disclosed embodiments can be used individually or in any suitable combination thereof. It should also be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that all within the scope of the appended claims. Further, the mere fact that different features are recited in mutually difference dependent or independent claims does not indicate that a combination of these features cannot be advantageously used, such a combination remaining within the scope of the aspects of the invention.

What is claimed is:

1. A method for processing a substrate in a substrate processing apparatus, the method comprising:
   providing a drive section with at least one motor or transmission having a max available torque;
   providing a robotic manipulator with a substrate holder, the robotic manipulator having a transport path with at least one path segment of the transport path being effected. with the at least one motor or transmission;
   providing a robotic manipulator controller operably coupled to the drive section;
   generating, with the robotic manipulator controller, a forward bang-bang max torque trajectory of the robotic manipulator along the at least one path segment from a start point of the at least one path segment towards an end point of the at least one path segment, the generated forward bang-bang max torque trajectory being defined by the max available torque;
   generating, with the robotic manipulator controller, a reverse bang-bang max torque trajectory of the robotic manipulator along the at least one path segment from the end point of the at least one path segment towards the start point of the at least one path segment, the reverse bang-bang max torque trajectory being defined by the max available torque, wherein the at least one path segment, the end point of the at least one path segment and the start point of the at least one path segment are all common to the generation of the forward bang-bang max torque trajectory and the generation of the reverse bang-bang max torque trajectory; and
   combining, with the robotic manipulator controller, the forward and reverse bang-bang max torque trajectories to obtain a complete bang-bang max torque trajectory, where the forward and reverse bang-bang max torque trajectories of the at least one path segment are blended together with a smoothing bridge joining the forward and reverse bang-bang max torque trajectories in a position-velocity reference frame with substantially no discontinuity between the forward and reverse bang-bang max torque trajectories.

2. The method of claim 1, wherein the complete bang-bang max torque trajectory is unparameterized and is a time-optimal trajectory throughout the at least one path segment.

3. The method of claim 1, wherein the smoothing bridge is connected to each of the forward and reverse bang-bang max torque trajectories at respective end points of the smoothing bridge, where each end point of the smoothing bridge is tangent to a respective one of the forward and reverse bang-bang max torque trajectories at the respective end points in the position-velocity reference frame.

4. The method of claim 3, wherein characteristics of a trajectory of the smoothing bridge at ail points in the smoothing bridge are equal to or below corresponding characteristics of the forward and reverse bang-bang max torque trajectories as extending respectively forward and reverse from the respective end points.

5. The method of claim 1, wherein the complete bang-bang max torque trajectory is substantially independent, of the transport path.

6. The method of claim 1, wherein the acceleration along the transport path is substantially continuous for and between the forward bang-bang max torque trajectory, the reverse bang-bang max torque trajectory and the smoothing bridge.

7. The method of claim 1, wherein the smoothing bridge is a numerical solution that fits a curve between the forward and reverse bang-bang max torque trajectories.

8. The method of claim 7, wherein the smoothing bridge comprises a quadratic Bezier curve, a third order Bezier curve or cubic spline.

9. The method of claim 1, wherein a respective complete bang-bang max torque trajectory including a respective smoothing bridge is generated for each of the at least one path segments.

10. The method of claim 1, wherein the method further includes blending the endpoint of adjacent ones of the at least one path segment together with a smoothing bridge.

11. A substrate processing tool comprising:
   a drive section with at least one motor or transmission having a max available torque;
   a robotic manipulator including a substrate holder that travels along a transport path having at least one path segment; and
   a controller connected to the robotic manipulator, the controller being configured to
      generate a forward bang-bang max torque trajectory of the robotic manipulator along the at least one path segment from a start point of the at least one path segment towards an end point of the at least one path segment, the generated forward bang-bang max torque trajectory being defined by the max available torque,
      generate a reverse bang-bang max torque trajectory of the robotic manipulator along the at least one path segment from the end point of the at least one path segment towards the start point of the at least one path segment, the reverse bang-bang max torque trajectory being defined by the max available torque wherein the at least one path segment, the end point of the at least one path segment and the start point of the at least one path segment are all common to the generation of the forward bang-bang max torque trajectory and the generation of the reverse bang-bang max torque trajectory, and combine the forward and reverse bang-bang max torque trajectories to obtain a complete bang-bang max torque trajectory, where the forward and reverse bang-bang max torque trajectories of the at least one path segment are blended together with a smoothing bridge joining the forward and reverse bang-bang max torque trajectories in a position-velocity reference frame with substantially no discontinuity between the forward and reverse bang-bang max torque trajectories.

12. The tool of claim 11, wherein the complete bang-bang max torque trajectory is unparameterized and is a time-optimal trajectory throughout the at least one path segment.

13. The tool of claim 11, wherein the controller is further configured to connect the smoothing bridge to each of the forward and reverse bang-bang max torque trajectories at respective end points of the smoothing bridge, were each end point of the smoothing bridge is tangent to a respective one of the forward and reverse bang-bang max torque trajectories at the respective end points in the position-velocity reference frame.

14. The tool of claim 13, wherein characteristics of a trajectory of the smoothing bridge at all points in the smoothing bridge are equal to or below corresponding characteristics of the forward and reverse bang-bang max torque trajectories as extending respectively forward and reverse from the respective end points.

15. The tool of claim 11, wherein the acceleration along the transport path is substantially continuous for and between the forward bang-bang max torque trajectory, the reverse bang-bang max torque trajectory and the smoothing bridge.

16. The tool of claim 11, wherein the smoothing bridge comprises a quadratic Bezier curve, a third order Bezier curve or a cubic spline.

17. The tool of claim 11, wherein the controller is further configured to generate a respective complete bang-bang max torque trajectory including a respective smoothing bridge for each of the at least one path segments.

18. The tool of claim 11, wherein the controller is further configured to blend the endpoints of adjacent ones of the at least one path segment together with a smoothing bridge.

19. The tool of claim 11, wherein the complete bang-bang max torque trajectory is substantially independent of the transport path.

* * * * *